(12) United States Patent
Dubois et al.

(10) Patent No.: US 8,957,500 B2
(45) Date of Patent: Feb. 17, 2015

(54) HIGH-VOLTAGE INTEGRATED METAL CAPACITOR AND FABRICATION METHOD

(71) Applicant: NXP B.V., Eindhoven (NL)

(72) Inventors: Jerôme Guillaume Anna Dubois, San Jose, CA (US); Piet Wessels, San Jose, CA (US)

(73) Assignee: NXP B.V., Eindhoven (NL)

( * ) Notice: Subject to any disclaimer, the term of this patent is extended or adjusted under 35 U.S.C. 154(b) by 49 days.

(21) Appl. No.: 13/648,882

(22) Filed: Oct. 10, 2012

(65) Prior Publication Data

US 2014/0097516 A1    Apr. 10, 2014

(51) Int. Cl.
  *H01L 27/02*  (2006.01)
(52) U.S. Cl.
  USPC .................. 257/532; 257/534; 257/E21.008; 438/391; 438/393
(58) Field of Classification Search
  CPC ...................................................... G01N 27/18
  USPC ................. 257/532, E29.343; 438/391, 393
  See application file for complete search history.

(56) References Cited

U.S. PATENT DOCUMENTS

| | | | |
|---|---|---|---|
| 6,372,570 B1 | 4/2002 | Gris et al. | |
| 6,940,114 B2* | 9/2005 | Oh et al. | 257/296 |
| 2002/0149086 A1 | 10/2002 | Aoki | |
| 2004/0027783 A1* | 2/2004 | Wang et al. | 361/306.3 |
| 2006/0087029 A1 | 4/2006 | Imanaka et al. | |
| 2006/0186450 A1* | 8/2006 | Larkin et al. | 257/306 |
| 2006/0214670 A1* | 9/2006 | Naidu et al. | 324/536 |
| 2008/0185680 A1* | 8/2008 | Cheng et al. | 257/532 |
| 2008/0290444 A1 | 11/2008 | Crawley et al. | |
| 2010/0032803 A1* | 2/2010 | Lippitt et al. | 257/534 |
| 2010/0224960 A1 | 9/2010 | Fischer | |
| 2012/0112314 A1* | 5/2012 | Jou et al. | 257/532 |

OTHER PUBLICATIONS

Extended European Search Report for European Patent Appln. No. 13183995.3 (Feb. 7, 2014).

* cited by examiner

*Primary Examiner* — Cheung Lee
*Assistant Examiner* — Stephen Bradley

(57) ABSTRACT

A high-voltage metal capacitor with easy integration into existing semiconductor manufacturing processes can provide isolation capacitors up to several kilovolts. The capacitor includes a support layer with internal structure, including a lower place, a bond pad on the support layer, an upper plate disposed on the support layer, the upper plate being arranged above the lower plate, a dielectric layer, at least part of which is between the lower and upper plates, and a passivation layer, at least part of which covers at least part of the upper plate and part of the dielectric layer. A first opening extends from the surface through the passivation and dielectric layers to the lower plate, and a second opening extends from the surface through the passivation layer to the upper plate. A method of manufacturing the capacitor.

17 Claims, 3 Drawing Sheets

HIGH-VOLTAGE INTEGRATED METAL CAPACITOR AND FABRICATION METHOD

BACKGROUND OF THE INVENTION

Aspects of the present disclosure relate to apparatuses, devices, and methods involving integrated capacitors. Such capacitors are suited for use in automotive applications, including automotive isolator devices, which are components that allow the safe transmission of electrical signals between different voltage domains.

More specifically, many automotive applications for electric and hybrid vehicles (electrically driven vehicles) require a high-voltage signal isolator, which can be integrated on a chip. The isolator can be of either single chip or multi-chip design. This invention is directed to an easy to integrate high-voltage capacitor suitable for use in such automotive isolator applications. This invention is not intended to be limited just to such applications, however, and can be employed anywhere there is electrical signaling across different voltage domains, such as in marine and aviation applications.

For example, signal circuits may be galvanically isolated from one another using capacitive coupling on signal paths between the circuits. As a result of such isolation, the circuits operate in separate voltage domains that are not referenced to one another by a common ground voltage level. Consequently, large voltage differences may arise between the different voltage domains. Galvanic isolation has been used for signaling between such different voltage domains in a variety of different applications. For instance, galvanic isolation can be provided between multiple integrated circuit chips, which can be located within the same package or in different packages. Signals can be passed between the integrated circuits using galvanic isolation techniques.

One method of galvanic isolation uses capacitors in the signal paths between two circuits to block DC voltages and attenuate low-frequency signals while transmitting high-frequency signals. Such capacitors can be part of the integrated circuit, as elements formed by the Metal1 to Metal5 (or Metal 6) layers of the integrated circuit fabrication process. However, since large voltage differences may arise between isolated voltage domains for some applications, possibly on the order of several kilovolts for transients, capacitors are required that have higher breakdown voltages than can be achieved using this manufacturing technique.

Also, physical space constraints may make it difficult to implement capacitors having the required breakdown voltage in the fabricated integrated circuits.

For example, a parallel plate capacitor may be implemented alongside other circuitry in an integrated circuit (IC) made using conventional processes for fabricating ICs with multiple internal metal layers (e.g., CMOS). Two capacitor plates are implemented in different metallization layers of the IC and are separated by a dielectric layer. The breakdown voltage of the resulting parallel plate capacitor is in part dependent upon the thickness of the dielectric layer. For higher voltage applications, the thickness of the dielectric layer can be increased to provide a higher breakdown voltage. However, in some CMOS processes, the maximum dielectric thickness that can be achieved is limited to about 5-10 microns. For some applications, this thickness is not adequate to provide a capacitor possessing the breakdown voltage required to insure satisfactory operation.

SUMMARY OF THE INVENTION

This invention describes a capacitor capable of handling high voltages (in to the several kV range), and a method of fabricating the same Furthermore, this implementation of a high-voltage capacitor can easily be tuned to handle higher voltages with relatively simple changes in the wafer processing.

By using one operation for both the upper plate of the capacitor and the top metal of the IC, it is possible to reduce the number of corresponding extra masking steps from two to one.

In accordance with this invention, an integrated circuit capacitor includes a support layer having a internal integrated circuit structure, including a lower plate, a bond pad disposed on the support layer, an upper plate disposed on the support layer, the upper plate being arranged above the lower plate, a dielectric layer, at least a portion of which is arranged between the lower and upper plates, and a passivation layer, at least a portion of which covers at least a portion of the upper plate and a portion of the dielectric layer. A first opening extends through the passivation layer to the bond pad, and a second opening extends from the surface through the passivation layer to the upper plate.

In some cases, the integrated circuit capacitor can be such that, in a lateral view orientation, the first opening and the second opening are offset.

In some cases, the integrated circuit capacitor can be such that the support layer is formed by a semiconductor process having a maximum dielectric layer formation thickness, and the dielectric layer has a thickness that is greater than the maximum dielectric layer formation thickness.

In some cases the integrated circuit capacitor can be such that a surface of the passivation layer is substantially planar.

An automotive isolator device can include such an integrated circuit capacitor.

A process for forming an integrated circuit capacitor includes the steps of providing a support layer having a surface, the support layer having a internal integrated circuit structure, including a lower plate, providing a bond pad on a portion of the surface of the support layer, providing a dielectric layer on the support layer and the bond pad, and providing an upper plate on a portion of the dielectric layer. This process also includes providing a passivation layer on the dielectric layer and the upper plate, forming a first opening through the passivation layer and the dielectric layer to expose at least some of a surface of the bond pad, and forming a second opening through the passivation layer to expose at least some of a surface of the upper plate.

In some cases, in the process the steps of forming the first and second openings can be performed together:

In some cases, in the process, when the integrated circuit capacitor is seen in a lateral view orientation, the first and second openings are offset.

In some cases, in the process, the support layer is formed by a semiconductor process having a maximum dielectric layer formation thickness, and the dielectric layer has a thickness that is greater than the maximum dielectric layer formation thickness.

In some cases, in the process, the step of providing the upper plate includes metal deposition and patterning of a deposited metal.

In some cases, in the process, the steps of forming the first and second openings both involve etching.

In some cases, the process is performed after a top metal etch and strip process which completes formation of the support layer.

BRIEF DESCRIPTION OF THE DRAWINGS

The invention will be described in greater detail hereinafter with reference to example embodiments depicted in the accompanying drawings, described below, and which are illustrative and to which the invention is not limited.

DETAILED DESCRIPTION OF EXEMPLARY EMBODIMENTS

The invention involves integrating the fabrication of a high-voltage capacitor into an existing IC manufacturing process flow. This is accomplished by providing an additional insulator layer (a dielectric) and another, overlying, metal layer, which can be used as the top plate of the high-voltage capacitor. The added insulator layer can be increased in thickness beyond that which is possible using the existing IC manufacturing process, and so can provide a capacitor with a breakdown voltage sufficiently high to handle higher voltages than can be tolerated by capacitors made using conventional IC manufacturing processes.

The added insulator layer can be increased in thickness to a large extent, beyond that which is possible with the customary IC fabrication process. Also, the top metal plate of the formed capacitor only serves as a capacitor plate, and does not have any connections with underlying metal layers. A further benefit to this invention is that the insulator layer and top plate are formed after the existing processing steps for the IC, meaning those earlier processing steps are not affected.

Figure 1:
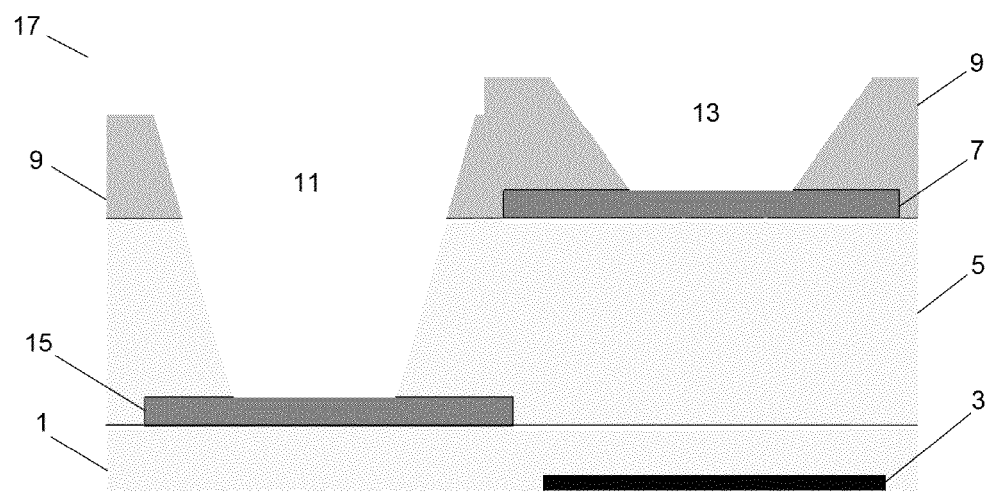
FIG. 1 is a side cross sectional view of a capacitor in accordance with this invention.

By way of non-limiting example, FIG. 1 depicts a capacitor 17 in accordance with this invention. The capacitor 17 includes a support layer 1. Support layer 1 contains a lower plate 3, located in one of the multiple IC layers (not shown) that were previously formed through the conventional processing. The support layer 1 has electrical properties which are sufficiently insulative to prevent the IC layers in support layer 1 and any underlying circuitry (not shown) from being adversely affected by electrical fields from the electrical components that are to be formed on support layer 1, and which electrical components are described below.

Lower plate 3 is formed within the support layer 1. Together, the support layer 1 and the internal lower plate 3 can be fabricated using a known 5-metal process, in which case the lower plate 3 is part of the metal 5 layer. The support layer 1 is manufactured with an internal integrated circuit structure (not shown). The lower plate 3 can be made in any of the standard metal layers of the IC. This invention is not limited to use with ICs made by a 5-metal process, it can be used with ICs made by any process.

Bond pad 15 is formed on the support layer 1, and bond pad 15 is electrically connected, via internal circuitry (not shown), to the lower plate 3. Bond pad 15 is preferably separated laterally from lower plate 3 and upper plate 7 by a distance sufficient to avoid any problems due to the high voltages which will arise when the capacitor 17 is charged.

Next, a layer of dielectric material 5, of any desired thickness and any suitable composition, is formed on the lower plate 3 and support layer 1 Alternatively, a stack of different types of dielectrics can be provided to optimize device characteristics. Since this structure is decoupled from the IC structure in the support layer 1 (which can include standard CMOS elements), there is great flexibility in the choice and thickness of materials that can be used. An upper plate 7, of any suitable type, thickness and profile of metal, is formed on the dielectric layer 5, so that the lower and upper plates 3 and 7 and the dielectric layer 5 together define a capacitor. The upper plate 7 is preferably arranged so that it has a large overlap with the lower plate 3 in order to maximize the device's capacitance (this is shown in FIG. 1, a side cross-sectional view).

A passivation layer 9 is formed over the upper plate 7 and exposed portions of the dielectric layer 5. Passivation material of the type used for CMOS fabrication can be used.

An opening 11 is formed to extend through the passivation layer 9 and dielectric layer 5 to the lower plate 3 (for clarity, only a single opening 11 is shown, but it will be understood that multiple openings could be provided). An opening 13 is formed to extend through the passivation layer 9 to the upper plate 7 (for clarity, only a single opening 13 is shown, but it will be understood that multiple openings could be provided). Openings 11 and 13 can be formed by any suitable manufacturing technique, such as wet or dry etching. Since opening 11 is deeper than opening 13, it may be desired to begin opening 11 before beginning opening 13. The openings 11, 13 also could be opened by separate etching operations. Although the openings 11 and 13 shown in FIG. 1 are tapered, other shaped openings, such as straight-sided or reverse-tapered, could be provided. Also, a non-critical etchback could be performed above opening 11 to adapt the total stack to the amount to be etched on the opening 13. The latter is preferably performed before passivation deposition, but in theory also could be done after. Openings 11 and 13 can be relatively large compared to the size of the lower and upper plates 3 and 7, allowing signal leads (not shown) to be easily bonded to the lower and upper plates 3 and 7 (other suitable lead connection techniques also could be used). Signals then can be sent to or received from the capacitor 17 through those signal leads.

This configuration enables electrical connections to the lower and upper plates 3 and 7, and all other pads which may be provided for the circuitry in the IC elements of the support layer 1, to be made through the passivation layer 9, and not through the support layer 1 and any circuitry within or under that support layer 1. This protects the support layer 1 and any circuitry within or under support layer 1 from the high-voltage fields which may arise between the upper and lower plates 3, 7 of the capacitor 17.

Because electrical connections with the lower and upper plates 3 and 7 are made through the covering passivation layer 9, the upper plate 7 blocks direct downward access to the lower plate 3. Instead, bond pad 15, which is in electrical connection with the lower plate 3, is provided at a position offset laterally from the lower plate 3 (and associated opening 11). This allows the openings 13 and 11 which electrical connection to those plates, respectively, to be spaced apart and not interfere with each other. The upper plate 7 (and associated opening 13) are separated from the bond pad 15 (and associated opening 11) by a distance sufficient to keep a suitable portion of the dielectric layer 5 between those structures that will allow the capacitor 17 to function for the expected voltage levels without breakdown.

In an alternative configuration (not shown), the bond pad 15 could serve as the lower plate of the capacitor, in which case the bond pad would be shaped with a portion underlying the top plate 7 and serving as the capacitor plate, and a portion extending away from the underlying portion (by way of non-limiting example, this structure could be dumbbell-shaped). The portion of the bond pad 15 extending beneath opening 11, is exposed by the opening 11 and allows external electrical contact thereto.

The size, thickness and shape of each of the upper and lower capacitor plates 3 and 7, and the thicknesses of the dielectric layer 5 and passivation layer 9 can be chosen as desired. By way of non-limiting example, it may be preferable for the elements subject to high voltage to be rounded. Also, the thickness of the elements can be chosen according to the anticipated voltages. This is easily accomplished because the required fabrication steps are separate from the processing of the IC elements of the support layer 1 (e.g., which is done by CMOS processing). The capacitor plates 3 and 7 can be formed from any suitable material, such as the typical materials used in CMOS fabrication, e.g., Al and Cu, with suitable barrier layers, etc. Likewise, any suitable dielectric material can be used for dielectric layer 5, such as silicon oxide, silicon nitride, and stacks of multiple material. Passivation layer 9 can be formed in the usual CMOS manner, from stacks of oxides, nitrides and P-containing layers.

Next, a process for forming a capacitor as shown in FIG. 1 will be described.

Figure 2:
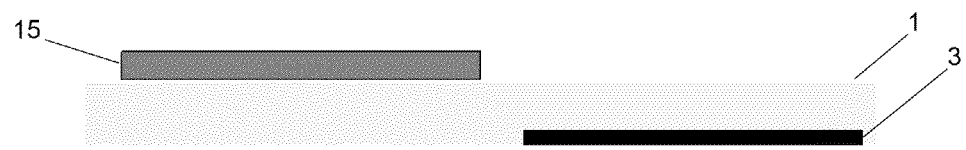
FIG. 2 is a side cross sectional view of a first step of a capacitor fabrication process.

As depicted in FIG. 2, a support layer 1 having a internal integrated circuit structure (not shown) is provided. Support layer 1 can be formed using a conventional process, such as a 5-metal layer process. Support layer 1 includes lower plate 3, which is preferably formed in one of the metal layers produced by normal CMOS processing, e.g., the top metal. but other lower metals (that is, metal layers) could be used. Accordingly, FIG. 2 shows the last standard processing step of a 5-metal layer process following formation of the lower plate 3 within the support layer 1 and the bond pad 15 on the support layer 1 after top metal etch and strip. For simplicity, the other internal structure of support layer 1 is not shown. If desired, bond pad 15 could be formed on the support layer 1 using a process subsequent to the conventional process that resulted in the support layer 1.

Figure 3:
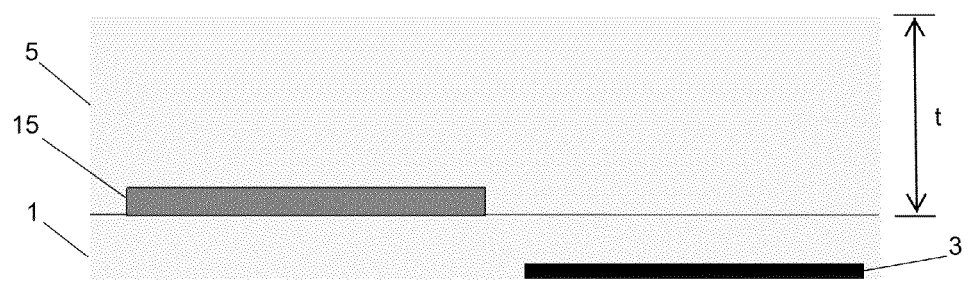
FIG. 3 is a side cross sectional view of a further step of the capacitor fabrication process.

Next, as shown in FIG. 3, a layer of dielectric material 5 is deposited on the exposed portion of support layer 1 and bond pad 15 (by way of non-limiting example, this could be accomplished by deposition and/or subsequent oxidation steps). The layer of dielectric material 5 is then planarized to a desired thickness t. The layer of dielectric material 5 is a thick layer (e.g., an oxide) that is different from the standard oxide stack that would be formed if metal capacitors were to be formed within the support layer 1 in known fashion (e.g. Metal5 (or Metal6) to Metal1 capacitors). As a result of this step, an additional thickness of dielectric material will be present between the lower and upper plates.

Figure 4:
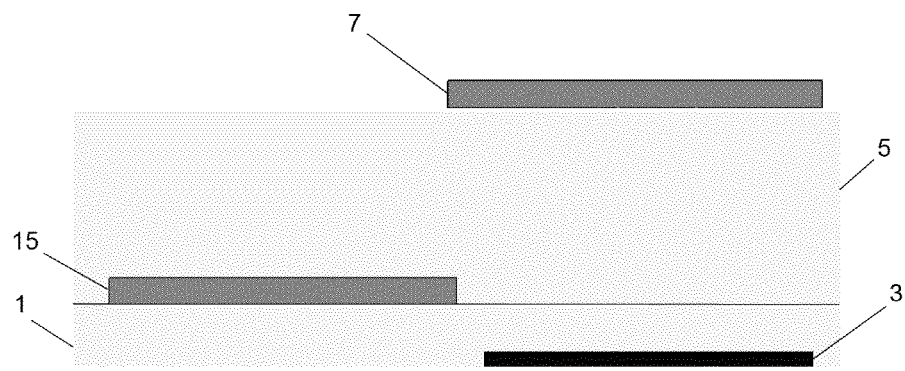
FIG. 4 is a side cross sectional view of a further step of the capacitor fabrication process.

Turning to FIG. 4, a metal deposition step and a subsequent patterning step are performed to provide the upper plate 7 atop the dielectric layer 5. The lower and upper plates 3 and 7 and dielectric layer 5 together define a capacitor. Optionally, at this state, a partial or full oxide etch could be performed above bond pad 15 to facilitate the later creation of opening 11 in a following step.

Figure 5:
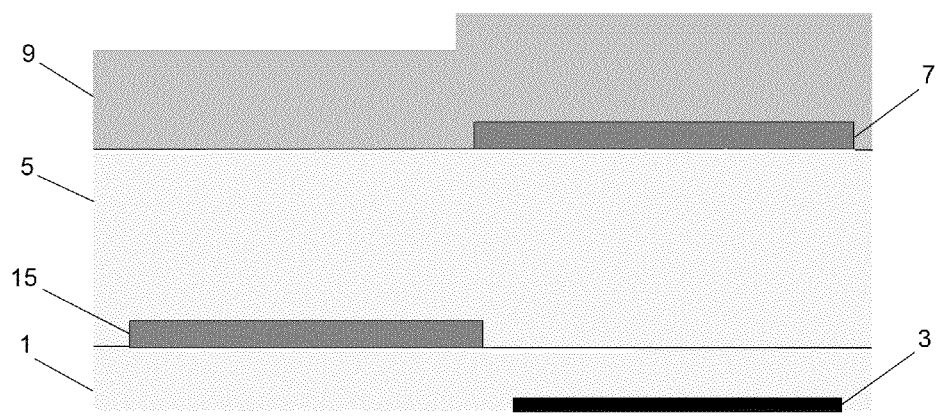
FIG. 5 is a side cross sectional view of a further step of the capacitor fabrication process.

Then, as shown in FIG. 5, a passivation layer 9 is formed on the upper plate 7 and exposed portions of the dielectric layer 5. The top surface of the passivation layer 9 may reflect the shape of the underlying top place 7, and so may not be even.

Finally, openings 11 and 13 extending from the surface of the passivation layer 9 towards the bond pad 15 and upper plate 7, respectively, are formed. Openings 11 and 13 can be formed using known etching techniques, or any other suitable techniques now or hereafter known for the selective removal of material. The openings 11 and 13 can be formed sequentially or simultaneously. Formation of openings 11 and 13 results in exposure of portions of the bond pad 15 and upper plate 7. Electrical signal leads for device operation can then be attached to those exposed portions in any suitable manner now known or hereafter discovered.

If desired, a photoexposure step and an additional etching step (not shown) can be performed to reduce the thickness of portion of the passivation layer 9 covering the upper plate 7. Likewise, the passivation layer 9 can be planarized to have a flat surface.

The electrical properties of the capacitor 17 can be controlled by suitably choosing the thickness t of the dielectric layer 5, the material from which dielectric layer 5 is made, and the geometry of the lower and upper plates 3 and 7. For example, by increasing the thickness t of dielectric layer 5 (e.g., by increasing the thickness of the oxide layer during an oxidation step), the breakdown voltage of capacitor 17 can be increased.

Through this process a high-voltage capacitor can be formed with a breakdown voltage which is greater than that possible were the capacitor to be formed using the Metal1 to Metal5 layers of the support layer 1.

Various exemplary embodiments are described in reference to specific illustrative examples. The illustrative examples are selected to assist a person of ordinary skill in the art to form a clear understanding of, and to practice the various embodiments. However, the scope of systems, structures and devices that may be constructed to have one or more of the embodiments, and the scope of methods that may be implemented according to one or more of the embodiments, are in no way confined to the specific illustrative examples that have been presented. On the contrary, as will be readily recognized by persons of ordinary skill in the relevant arts based on this description, many other configurations, arrangements, and methods according to the various embodiments may be implemented.

To the extent positional designations such as top, bottom, upper, lower have been used in describing this invention, it will be appreciated that those designations are given with reference to the corresponding drawings, and that if the orientation of the device changes during manufacturing or operation, other positional relationships may apply instead. As described above, those positional relationships are described for clarity, not limitation.

The present invention has been described with respect to particular embodiments and with reference to certain drawings, but the invention is not limited thereto, but rather, is set forth only by the claims. The drawings described are only schematic and are non-limiting. In the drawings, for illustrative purposes, the size of various elements may be exaggerated and not drawn to a particular scale. It is intended that this invention encompasses inconsequential variations in the relevant tolerances and properties of components and modes of operation thereof. Imperfect practice of the invention is intended to be covered.

Unless clear from context, the use in this application of the singular does not necessarily exclude the plural, and the use of the plural does not necessarily exclude the singular.

Where the term "comprising" is used in the present description and claims, it does not exclude other elements or steps. Where an indefinite or definite article is used when referring to a singular noun, e.g. "a" "an" or "the", this includes a plural of that noun unless something otherwise is specifically stated. Hence, the term "comprising" should not be interpreted as being restricted to the items listed thereafter; it does not exclude other elements or steps, and so the scope of the expression "a device comprising items A and B" should not be limited to devices consisting only of components A and B. This expression signifies that, with respect to the present invention, the only relevant components of the device are A and B.

What is claimed is:

1. An integrated circuit capacitor, comprising:
   a support layer having an internal integrated circuit structure, including a lower plate;
   a bond pad disposed directly on the support layer such that the bond pad and the support layer are contiguous;
   an upper plate disposed on the support layer, the upper plate being arranged above the lower plate;
   a dielectric layer, at least a portion of which is arranged between the lower plate and the upper plate;
   a passivation layer, at least a portion of which covers at least a portion of the upper plate and at least a portion of the dielectric layer, the passivation layer having a surface;
   a first opening extending from the surface through the passivation layer and the dielectric layer to the bond pad;
   a second opening extending from the surface through the passivation layer to the upper plate; and
   wherein the dielectric layer and the passivation layer are distinct layers.

2. The integrated circuit capacitor according to claim 1, wherein, in a lateral view orientation, the first opening and the second opening are offset.

3. The integrated circuit capacitor according to claim 1:
   wherein the support layer has a preselected thickness; and
   wherein the dielectric layer has a thickness that is greater than the preselected thickness.

4. The integrated circuit capacitor according to claim 1, wherein a surface of the passivation layer is substantially planar.

5. An automotive isolator device comprising the integrated circuit capacitor according to claim 1.

6. A process for forming an integrated circuit capacitor, comprising:
   providing a support layer having a surface, the support layer having an internal integrated circuit structure, including a lower plate;
   providing a bond pad directly on a portion of the surface of the support layer such that the bond pad and the support layer are contiguous;
   providing a dielectric layer on the support layer and the bond pad,
   providing an upper plate on a portion of the dielectric layer,
   providing a passivation layer on the dielectric layer and the upper plate,
   forming a first opening through the passivation layer and the dielectric layer to expose at least some of a surface of the bond pad; and
   forming a second opening through the passivation layer to expose at least some of a surface of the upper plate.

7. The process according to claim 6, wherein the steps of forming the first opening and forming the second opening are performed together.

8. The process according to claim 6, wherein, in a lateral view orientation, the first opening and the second opening are offset.

9. The process according to claim 6:
   wherein providing the support layer includes forming the support layer to a preselected thickness using a semiconductor process having a preselected dielectric layer formation thickness; and
   wherein providing the dielectric layer includes providing the dielectric layer at a thickness that is greater than the preselected dielectric layer formation thickness.

10. The process according to claim 6, wherein the step of providing the upper plate includes metal deposition and patterning of a deposited metal.

11. The process according to claim 6, wherein the steps of forming the first opening and the second opening both involve etching.

12. The process according to 6, wherein the process is performed after a top metal etch and strip process which completes formation of the support layer.

13. An integrated circuit capacitor, comprising:
    a support layer having an internal integrated circuit structure, including a lower plate recessed below an upper surface of the support layer;
    a bond pad disposed directly on the upper surface of the support layer and laterally offset from the lower plate;
    a dielectric layer of a first material, at least a portion of which is arranged between the lower plate and the upper plate;
    an upper plate disposed on an upper surface of the dielectric layer, the upper plate being arranged above the lower plate;
    a passivation layer of a second material, at least a portion of which covers at least a portion of a side and top surface of the upper plate and at least a portion of the dielectric layer, the passivation layer having a surface;
    a first opening extending from the surface through the passivation layer and the dielectric layer to the bond pad; and
    a second opening extending from the surface through the passivation layer to the upper plate.

14. The integrated circuit capacitor according to claim 13, wherein the upper and lower plate comprise aluminum or copper and a barrier layer surrounding the aluminum or copper.

15. The integrated circuit capacitor according to claim 13, wherein the support layer is configured and arranged to protect the internal integrated circuit structure from high-voltage fields between the upper and lower plates.

16. The integrated circuit capacitor according to claim 13, wherein the first and second materials are different.

17. The integrated circuit capacitor according to claim 13, wherein the upper surface of the dielectric layer and a lower surface of the passivation layer form an interface there between.

* * * * *